April 17, 1956 F. PAPOUSCHEK 2,742,572

HARMONIC GENERATOR CIRCUIT

Filed April 16, 1954

INVENTOR.
FRANZ PAPOUSCHEK
BY F. A. Rechif
AGENT 2,742,572
Patented Apr. 17, 1956

2,742,572

HARMONIC GENERATOR CIRCUIT

Franz Papouschek, Pt. Claire, Quebec, Canada, assignor to Radio Corporation of America, a corporation of Delaware Application April 16, 1954, Serial No. 423,725
The terminal 15 years of the term of the patent to be granted has been disclaimed
12 Claims. (Cl. 250—36)

Figure 1:
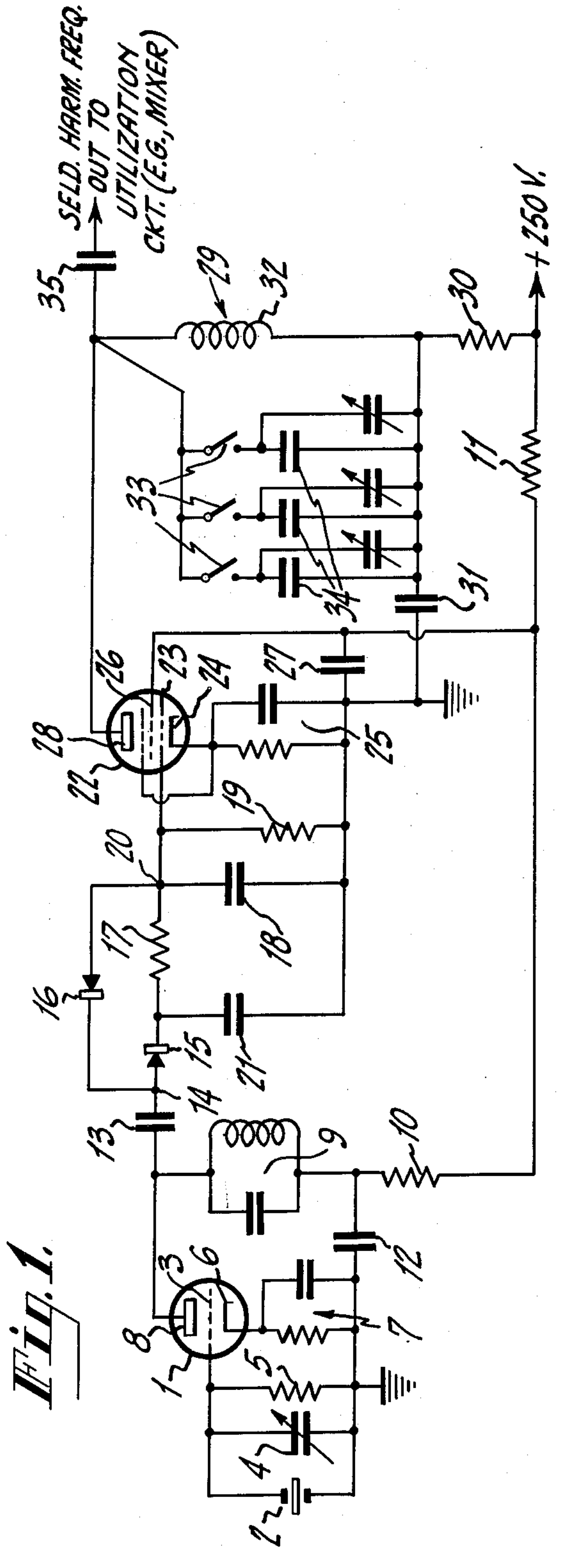

This invention relates to a harmonic generator circuit, and more particularly to a circuit for generating a large number of harmonically-related frequencies from a single fundamental frequency input.

In certain types of captive oscillator systems, for example in the system disclosed in my copending application, Serial No. 381,315, filed September 21, 1953, a harmonic generator which will generate harmonic frequencies over a rather wide range, is required. For example, in a communications receiver captive oscillator system for which the harmonic generator of this invention is eminently suitable, a range of harmonic frequencies from 3 to 22 mc. must be generated from a one-megacycle crystal-controlled (fundamental frequency) source which is used as input for the generator. Also, in order to provide the proper control action for the captive oscillator, it is necessary that the output amplitude of the harmonic generator be rather high and also be substantially constant throughout the entire required range of harmonic frequencies.

One known type of harmonic generator uses tubes operating as class C amplifiers, for the generation of the harmonic frequencies. However, such an arrangement gives greatly different output amplitudes for different harmonics, according to the particular current flow angle (the angle, relative to 360° of the input voltage applied to the grid, during which anode current flows) utilized. In fact, with this generator the amplitude of the harmonic frequencies varies inversely as the square of the number of the harmonic so that not only is the output amplitude far from constant throughout the harmonic frequency range, but also a high amplification is necessary to obtain a reasonable output amplitude, particularly for the higher-order harmonics.

Another known type of harmonic generator uses a single rectifier in series with the parallel combination of a resistor and a capacitor, all across the resonant output circuit of a fundamental frequency source, the voltage across the parallel RC combination being used as the input or grid voltage for an amplifier tube and an LC tuned circuit (tuned to the desired harmonic) being connected to the anode or output electrode of this tube. Under ideal conditions, a saw-tooth wave is produced on the grid of the amplifier tube, this wave having a harmonic content such that the amplitude of the harmonic frequencies varies inversely as the number of the harmonic. By suitable design of the LC tuned circuit, the amplification effected by the tube may be made to vary approximately directly as the number of the harmonic, so that reasonably constant amplitude of the harmonic frequency output from the tube may be realized. Although such a circuit is very useful for lower fundamental input frequencies and functions to give a reasonably constant harmonic frequency output for such lower fundamental frequencies, it has a rather serious drawback at higher fundamental input frequencies. For such higher frequencies, the resistance of the parallel resistor must be very low for effective operation, to discharge the capacitor in a time sufficiently short to produce the desired saw-tooth wave. However, for optimum operation it is very desirable that the resistance of the parallel resistor be high, both to match the input impedance of the amplifier tube and also to prevent undue loading of the fundamental frequency input source.

The present invention is related to the last-mentioned type of harmonic generator, and constitutes an improvement over known harmonic generators of such type.

An object of this invention is to devise a novel harmonic generator which provides a substantially constant harmonic frequency output amplitude over a wide range of harmonic frequencies.

Another object is to provide a harmonic generator of the rectifier-RC type which operates in optimum fashion even at high fundamental input frequencies and does not unduly load the fundamental frequency input source.

The objects of this invention are accomplished, briefly, in the following manner: The high alternating potential (RF) side of the resonant output circuit of the fundamental frequency input source (having a frequency, for example, of one mc.) is connected by way of a pair of oppositely-arranged diodes, one of which has a resistor in series therewith, to the grid side of a parallel RC combination which is connected in the input circuit of a vacuum tube amplifier, between the grid and cathode thereof. An LC tuned or resonant circuit is connected in the output or anode circuit of this amplifier tube, and this resonant circuit is capable of being tuned to any one of a multiplicity of harmonic frequencies. The harmonic frequency output is taken from across this tuned circuit.

Figure 2:
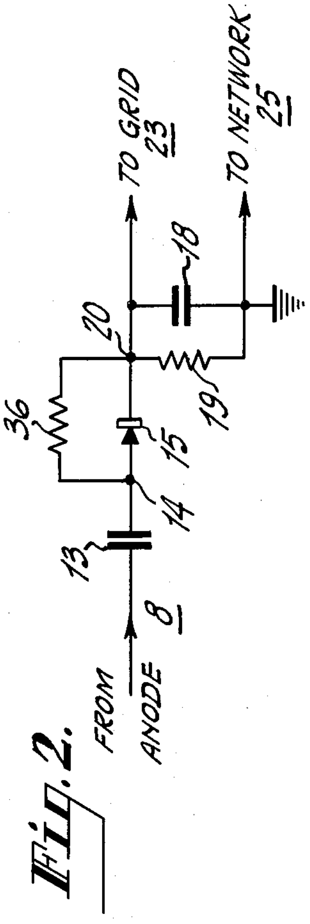

The foregoing as well as other objects of the invention will be best understood from the following description of an exemplification thereof, reference being had to the accompanying drawing, wherein Figs. 1 and 2 are diagrammatic representations of two different arrangements according to this invention.

Referring now to Fig. 1, a triode vacuum tube 1 is connected in a crystal oscillator circuit operating for example at one mc. per second, and serves as a source of fundamental frequency input waves for the harmonic generator of this invention. One electrode of a piezoelectric crystal 2 is connected to the grid 3 of triode 1 and the other electrode of this crystal is connected to ground. A trimmer capacitor 4 is connected across crystal 2, as is also a resistor 5. The cathode 6 of triode 1 is connected through a conventional RC network 7 to ground, in order to provide self-bias for tube 1. The triode anode 8 is connected to one end of a tuned LC circuit 9, while the other end of this circuit is connected through a resistor 10 and a resistor 11 to the positive terminal of a unidirectional voltage source, for example of 250 volts (designated +250 V.), in order to provide anode energizing potential for tube 1. The circuit 9 is tuned to the frequency of crystal 2, one mc., and the low RF potential end of this circuit is bypassed to ground through a capacitor 12.

Oscillatory energy of a frequency of one megacycle, the fundamental frequency, is developed at the upper or anode end of circuit 9, and this energy is applied through a coupling capacitor 13 to the common junction point 14 of a pair of interconnected diode rectifiers 15 and 16 which have their other electrodes connected to each other through a resistor 17. A capacitor 18 and a resistor 19 are connected in parallel from the common junction point 20 of resistor 17 and diode 16, to ground. The diodes 15 and 16 may be germanium diodes of the 1N48 type, and have their forward directions of conductivity connected oppositely with respect to points 14 and 20, so that, when point 14 is positive with respect to point 20, only diode rectifier 15 passes current (through resistor 17), while when point 14 is negative with respect to point 20, only diode rectifier 16 passes current.

During positive half-cycles of the sinusoidal one-mc. waves supplied from tuned anode circuit 9 to point 14, point 14 goes positive with respect to point 20 and diode 15 passes current to charge the capacitor 18 relatively slowly through resistor 17. The values of the components 17 and 18 are such (for example, resistor 17 may have a value of 25,000 ohms and capacitor 18 may have a value of 4.7 mmfd.) that this charging occurs in linear fashion, producing the "rising-voltage" portion of a saw-tooth voltage wave across capacitor 18 and resistor 19. During negative half-cycles of the sinusoidal one-mc. waves supplied from tuned anode circuit 9 to point 14, point 14 goes negative with respect to point 20 and diode 16 passes current to discharge the capacitor 18 substantially instantaneously through the very low forward resistance of of such diode, there being no extra lumped resistance in this discharge circuit. This discharge of the capacitor 18 produces the exceedingly rapid "falling-voltage" portion of a sawtooth voltage wave across capacitor 18 and resistor 19. As a result of the very low-resistance discharge path and the substantially linear charging path for capacitor 18, an almost perfect saw-tooth wave is produced across capacitor 18 and resistor 19, one saw-tooth cycle for each sinusoidal cycle of the one-mc. fundamental frequency input wave supplied from the crystal oscillator tank 9 to point 14.

The one-mc. input wave is developed between the anode end of resonant circuit 9 and ground. It may be seen that the resistor 19 is connected essentially in parallel across the output of the one-mc. source. If the second diode 16 were not provided as a discharge path for the capacitor 18 in accordance with this invention, the capacitor discharge (which is essential for the production of a saw-tooth voltage wave) would have to be effected by resistor 19, which means that for a fast discharge time such resistor would have to be rather small. However, a small resistor across the fundamental frequency source output would unduly load down the source, which is of course undesirable. According to this invention, however, the resistor 19 may be made quite large (about 500,000 ohms, for example) without appreciably affecting in an adverse way the shape of the saw-tooth wave which is desired. This large resistance has no appreciable effect on either the charging or discharging of capacitor 18. This large resistor, moreover, will not unduly load down the source. The use of a large resistor across the capacitor 18 is made possible according to this invention by the utilization of the second "discharging" diode 16.

In addition, since the discharging of capacitor 18 takes place through diode 16 to the anode end of resonant circuit 9, the energy stored in capacitor 18 during the positive half-cycles of the one-mc. input wave is returned to circuit 9 during the negative half-cycles of the input wave, thus conserving this energy.

A capacitor 21 is connected between the junction of resistor 17 and diode 15, and ground. This capacitor is several times as large as capacitor 18 (capacitor 21 may have a value of 15 mmfd., for example).

A D. C. path must be provided, for proper operation of the diode 15. Thus, if only a single diode 15 were used as in the prior art, diode 16 being omitted, this D. C. path would have to be provided by a resistor connected from point 14 to ground or the lower end of resistor 19. In such a case the sum of the two resistors (one of which is resistor 19 and the other of which is the resistor previously mentioned, connected between point 14 and ground) should be on the order of 22,000 ohms for optimum operation of the prior art circuit. This value is extremely low with respect to the desired high impedance looking into the harmonic generator (to prevent undue loading of the fundamental-frequency source) and with respect to the desired high output impedance of the harmonic generator (to couple into the grid circuit of a following tube).

In the circuit of Fig. 1, the resistor referred to in the preceding paragraph (from point 14 to ground) is omitted and the D. C. flows through diode 16 and resistor 17. A resistor such as 17 has to be inserted in series with one of the diodes, since otherwise one diode would cancel the operation of the other. The capacitor 21 provides a HF bypass to ground and increases the D. C. voltage developed in diode 15. This capacitor does not load the output of the harmonic generator because of the interposition of the resistor 17.

The saw-tooth voltage developed across capacitor 18 and resistor 19 is applied to the input of a pentode vacuum tube 22 which functions as an amplifier, by connecting point 20 to the control grid 23 of tube 22 and by connecting the opposite end of the parallel RC combination 18—19 to ground, to which the cathode 24 of tube 22 is connected through a parallel RC self biasing network 25. Tube 22 may be a type 6AU6, for example. Another reason why it is quite desirable to have a high resistance at 19, should now be apparent. The grid circuit of tube 22 being of high impedance, it is decidedly preferable to have a high impedance coupled to this grid, between the grid and cathode of the tube.

The screen grid 26 of tube 22 is connected through resistor 11 to the positive terminal of the 250-volt source, and is bypassed to ground for radio frequency energy by means of a capacitor 27. The anode 28 of tube 22 is connected through an LC tuned circuit 29 which serves as a harmonic selector and through a resistor 30 to the positive terminal of the 250-volt source, and the low RF potential end of tuned circuit 29 is bypassed to ground by an RF bypass capacitor 31. The tuned circuit 29 comprises an inductance coil 32 across which is selectively connected, by means of switches 33, one or more of a plurality of capacitors 34. The capacitors 34 are each provided with a trimmer capacitor, connected in parallel with its respective main capacitor, as shown. Although switches 33 are shown as separate single-pole switches, actually a thirty-position switch may be used for connecting the proper capacitor or capacitors 34 into circuit across inductance 32. This switch may be constructed as disclosed in my copending application, Serial No. 456,936 filed September 20, 1954. By selecting the proper capacitor 34, the tuned circuit 29 may be resonated to any selected harmonic (for example, any harmonic from 3 to 22 mc. if the fundamental input frequency is one mc.), and in this way the particular harmonic output frequency desired may be selected.

The particular harmonic frequency selected may be taken off from anode 28 and applied through a coupling capacitor 35 to a utilization circuit of any suitable kind. For example, this may be a mixer in a captive oscillator control system such as disclosed in my aforesaid copending application, Serial No. 381,315.

As previously described, the shape of the voltage wave produced across the combination 18—19, and applied to the grid 23 of the amplifier tube 22, is a substantially perfect saw-tooth wave. An analysis shows that such a waveform has a harmonic content such that the amplitude of the harmonic frequencies varies inversely as the number $n$ of the harmonic. According to this invention, the gain provided by the amplifier tube 22 is made to vary substantially directly as $n$, so that a substantially constant amplitude output for all harmonic frequencies is provided by the system of this invention. The resonant frequency of the circuit 29 is inversely proportional to the product of L and C, so that with a fixed L (inductance 29), for a low harmonic frequency the capacitance 34 selected would need to be large, while for a high harmonic frequency the capacitance C would need to be small. The load circuit resistance coupled to tube 22 (the impedance of the tuned or resonant circuit 29) is inversely proportional to the capacitance of this circuit, since the quantity ($\omega^2 LC$) is assumed to be large in comparison to unity, it being known that the impedance of a parallel LC resonant circuit of this type is $$\frac{\omega L}{1-\omega^2 LC}$$

Then, for a large capacitance C, the load circuit resistance would be low, while for a small capacitance the load circuit resistance would be high.

The gain provided by amplifier 22 is directly proportional to the load circuit resistance coupled to this tube, since the plate resistance for a pentode tube such as tube 22 is high. Therefore, for low harmonic frequencies (large capacitance C in 29, low load circuit resistance) the gain provided by amplifier tube 22 is relatively low, and this is what is needed to compensate for the relatively high amplitudes of these lower harmonics in the input saw-tooth voltage wave applied to amplifier tube 22. For high harmonic frequencies (small capacitance C in 29, high load circuit resistance) the gain provided by amplifier tube 22 is relatively high, and this is what is needed to compensate for the relatively low amplitudes of these higher harmonics in the input saw-tooth voltage wave applied to amplifier tube 22. In fact, this variation of amplifier gain with the tuning of the anode tuned circuit 29 can be made such as to substantially completely compensate for the decrease in amplitude with increase in harmonic number of the input saw-tooth voltage wave applied to amplifier tube 22, that is, the amplifier gain can be made to vary substantially directly as the number $n$ of the harmonic. Thus, a substantially constant amplitude of harmonic frequency output can be obtained with the circuit of this invention, over a very wide range of harmonic frequencies. Deviations from the exact compensation desired (amplifier gain directly proportional to $n$) can be corrected by adjusting the Q of the coil 32 on the ends of the range.

In a circuit built according to Fig. 1 and successfully tested, with 9 volts bias on tube 22 (the resistor of network 25 having a value of 5600 ohms) and an input signal of approximately ten volts from the crystal oscillator, best results were obtained with a grid current in tube 22 of three microamperes, providing a harmonic frequency output voltage of 2.5 volts over a range extending from 3 mc. to 22 mc. This output voltage was obtainable, however, even for higher harmonics.

The harmonic frequency generator of Fig. 1 has also been built and successfully tested at 200 cycles fundamental frequency, the resistors and capacitors of course being different for this case from those for the system operating at one-mc. fundamental frequency. In the low-fundamental-frequency case, the waveforms were observed on an oscilloscope.

Fig. 2 shows a modified harmonic generator, which was found to give very good results, particularly on the higher fundamental frequencies. This figure has been drawn in simplified form, in order to not clutter up the drawing unduly.

In Fig. 2, the second diode 16 is replaced by a resistor 36, and the resistor 17 is omitted, as is also the capacitor 21. In this case, the D. C. flows through the diode 15 and the resistor 36, which may have a value of about 22,000 ohms for optimum operation. In a test setup according to Fig. 2, with a voltage of 6.3 volts on the input, between point 14 and ground, and with a diode 15 of the 1N48 type, the D. C. through resistor 36 was found to be 80 microamperes. The circuit of Fig. 2 has been tested and found to operate satisfactorily, although not quite as efficiently as the circuit according to Fig. 1.

What is claimed is:

1. In a harmonic generator, a source of alternating current waves of fundamental frequency, a capacitor, a charging current path for charging said capacitor from said source including a unidirectional current flow device connecting said capacitor across said source, a separate discharging current path for said capacitor including a unidirectional current flow device connecting said capacitor across said source, and means for utilizing the voltage across said capacitor.

2. A generator as defined in claim 1, wherein the two devices are poled to conduct current in opposite directions.

3. A generator as defined in claim 1, wherein a resistor is connected in series in one of said current paths.

4. A generator as defined in claim 1, wherein the last-mentioned means includes an amplifier having input electrodes and includes also means for applying the voltage across said capacitor to said input electrodes.

5. A generator as defined in claim 1, wherein a resistor is connected in series in said charging current path, and wherein the two devices are poled to conduct current in opposite directions.

6. A generator as defined in claim 1, wherein a resistor is connected in series in said charging current path, wherein the two devices are poled to conduct current in opposite directions and wherein the last-mentioned means includes an amplifier having input electrodes and includes also means for applying the voltage across said capacitor to said input electrodes.

7. In a harmonic generator, a source of alternating current waves of fundamental frequency, a capacitor, a charging current path for charging said capacitor from said source including a unidirectional current flow device connecting said capacitor across said source, a separate discharging current path for said capacitor including a unidirectional current flow device connecting said capacitor across said source, an amplifier having input and output electrodes, means for applying the voltage across said capacitor to said input electrodes, a circuit coupled to said output electrodes and tuned to a desired harmonic frequency, and means for utilizing the harmonic frequency voltage developed across said tuned circuit.

8. A generator as defined in claim 7, wherein said tuned circuit is an inductance-capacitance circuit, and wherein the capacitances are switched to tune such circuit to the desired harmonic frequency.

9. A generator as defined in claim 7, wherein the two devices are poled to conduct current in opposite directions.

10. In a harmonic generator, a source of alternating current waves of fundamental frequency, two current flow paths each connected across the output of said source, one of said path comprising the series combination of a diode rectifier and a capacitor, the other of said paths comprising the series combination of another diode rectifier, a resistor, and said capacitor, said two rectifiers being poled to pass current in opposite directions, a resistor connected across said capacitor, an amplifier having input and output electrodes, means for applying the voltage across said capacitor to said input electrodes, a tuned circuit coupled to said output electrodes and tuned to a desired harmonic frequency, and means for utilizing the harmonic frequency voltage developed across said tuned circuit.

11. In a harmonic generator, a source of alternating current waves of fundamental frequency, two current flow paths each connected across the output of said source, one of said paths comprising the series combination of a rectifier, a resistor and a capacitor, the other of said paths comprising the series combination of another rectifier and said capacitor, said two rectifiers being poled to pass current in opposite directions, and means for utilizing the voltage across said capacitor.

12. A harmonic generator as defined in claim 11, wherein the last-named means includes an amplifier having input electrodes and includes also means for applying the voltage across said capacitor to said input electrodes.

References Cited in the file of this patent

UNITED STATES PATENTS

| | | |
|---|---|---|
| 2,401,481 | Harnett | June 4, 1946 |
| 2,588,551 | McCoy | Mar. 11, 1952 |